United States Patent
Dai et al.

(10) Patent No.: US 12,543,359 B2
(45) Date of Patent: Feb. 3, 2026

(54) CELLULAR STRUCTURE OF SILICON CARBIDE MOSFET DEVICE, AND SILICON CARBIDE MOSFET DEVICE

(71) Applicant: ZHUZHOU CRRC TIMES SEMICONDUCTOR CO., LTD., Hunan (CN)

(72) Inventors: Xiaoping Dai, Hunan (CN); Yafei Wang, Hunan (CN); Chengzhan Li, Hunan (CN); Haihui Luo, Hunan (CN)

(73) Assignee: ZHUZHOU CRRC TIMES SEMICONDUCTOR CO., LTD., Zhuzhou (CN)

( * ) Notice: Subject to any disclaimer, the term of this patent is extended or adjusted under 35 U.S.C. 154(b) by 424 days.

(21) Appl. No.: 17/774,849

(22) PCT Filed: Dec. 25, 2019

(86) PCT No.: PCT/CN2019/128387
§ 371 (c)(1),
(2) Date: May 5, 2022

(87) PCT Pub. No.: WO2021/088231
PCT Pub. Date: May 14, 2021

(65) Prior Publication Data
US 2022/0406896 A1 Dec. 22, 2022

(30) Foreign Application Priority Data
Nov. 8, 2019 (CN) .......................... 201911089381.4

(51) Int. Cl.
*H10D 62/832* (2025.01)
*H10D 12/01* (2025.01)
(Continued)

(52) U.S. Cl.
CPC ....... *H10D 62/8325* (2025.01); *H10D 12/031* (2025.01); *H10D 30/668* (2025.01); *H10D 62/127* (2025.01); *H10D 64/64* (2025.01)

(58) Field of Classification Search
CPC . H01L 29/1608; H01L 29/0696; H01L 29/47; H01L 29/66068; H01L 29/7813;
(Continued)

(56) References Cited

U.S. PATENT DOCUMENTS

| | | | |
|---|---|---|---|
| 10,777,689 B1 * | 9/2020 | Yau ...................... | H10D 62/822 |
| 2014/0306239 A1 * | 10/2014 | Mizukami ............ | H10D 84/146 |
| | | | 257/77 |

(Continued)

FOREIGN PATENT DOCUMENTS

| CN | 105074921 A | 11/2015 |
|---|---|---|
| CN | 106876485 A | 6/2017 |

(Continued)

OTHER PUBLICATIONS

International search report of PCT Patent Application No. PCT/CN2019/128387 issued on Aug. 10, 2020.

*Primary Examiner* — Matthew C Landau
*Assistant Examiner* — David W Ward (57) ABSTRACT

Disclosed is a cellular structure of a silicon carbide MOSFET device, and a silicon carbide MOSFET device. The cellular structure comprises: second conductive well regions located on two sides of the cellular structure and arranged within the surface of a drift layer, first conductive source regions located within the surfaces of the well regions, and a gate structure located at the center of the cellular structure and in contact with the source regions, the well regions, and the drift layer. The cellular structure further comprises a source metal layer located above the source regions and forming ohmic contact with the source regions; on two sides of the cellular structure, side trenches are formed down- (Continued)

wardly on regions of the drift layer that are not covered by the well regions; Schottky metal layers forming Schottky contact with the drift layer below the side trenches are arranged in the side trenches.

11 Claims, 9 Drawing Sheets

(51) Int. Cl.
  *H10D 30/66* (2025.01)
  *H10D 62/10* (2025.01)
  *H10D 64/64* (2025.01)
(58) Field of Classification Search
  CPC ........... H10K 59/80515; H10K 59/121; H10K 50/813; H10K 59/123; H10K 50/814; H10D 62/8325; H10D 62/127; H10D 64/64; H10D 30/668; H10D 12/031; H10D 12/01; H10D 12/035; H10D 12/038; H10D 18/01–031; H10D 30/028–0297; H10D 8/60; H10D 8/605; H10D 8/051

See application file for complete search history.

(56) References Cited

U.S. PATENT DOCUMENTS

| | | | |
|---|---|---|---|
| 2016/0079411 A1* | 3/2016 | Hino | H01L 29/0865 257/77 |
| 2018/0122933 A1* | 5/2018 | Matocha | H10D 84/146 |
| 2020/0295183 A1* | 9/2020 | Hatta | H10D 62/107 |

FOREIGN PATENT DOCUMENTS

| | | |
|---|---|---|
| CN | 107580725 A | 1/2018 |
| CN | 108615767 A | 10/2018 |
| CN | 109119419 A | 1/2019 |
| CN | 110350035 A | 10/2019 |

\* cited by examiner

CELLULAR STRUCTURE OF SILICON CARBIDE MOSFET DEVICE, AND SILICON CARBIDE MOSFET DEVICE

The disclosure claims the priority of Chinese patent application CN 201911089381.4, entitled "Cellular Structure of Silicon Carbide MOSFET Device, and Silicon Carbide MOSFET Device" and filed on Nov. 8, 2019, the entirety of which is incorporated herein by reference.

FIELD OF THE INVENTION

The disclosure relates to the technical field of semiconductor devices, and in particular, to a cellular structure of a silicon carbide MOSFET device, and a silicon carbide MOSFET device.

BACKGROUND OF THE INVENTION

Silicon carbide (SiC) is a new type of wide bandgap semiconductor material, and has excellent physical, chemical, and electrical properties, for example, silicon carbide has a breakdown electric field strength which is 10 times that of traditional silicon and a thermal conductivity which is 3 times that of silicon, which enable silicon carbide to be very attractive and have a good application prospect in power semiconductor devices, in particular in a high-power and high-temperature application environment.

Silicon carbide unipolar devices (such as a metal-oxide-semiconductor field effect transistor (MOSFET) and a Schottky barrier diode (SBD)) are more advantageous than bipolar devices (such as a PiN diode, an insulated gate bipolar transistor (IGBT), a thyristor and the like). This is not only because of the relevance to a turn-on voltage of 2V in a silicon carbide PN junction, but also due to the presence of a "bipolar degradation" phenomenon in silicon carbide bipolar devices. That is, combination is performed after carriers are injected (or stimulated), and nucleating and expanding of a single Schockley Stacking Fault (SSF) occur at a position of basal plane dislocation (BPD) or other dislocated sections of a basal plane. The expanded SSF results in a significant decrease in the lifetime of the carriers, thereby causing an increase in a voltage drop of a silicon carbide bipolar device and in a reverse bias leakage current, which goes against the reliability of the silicon carbide bipolar device.

Figure 1:
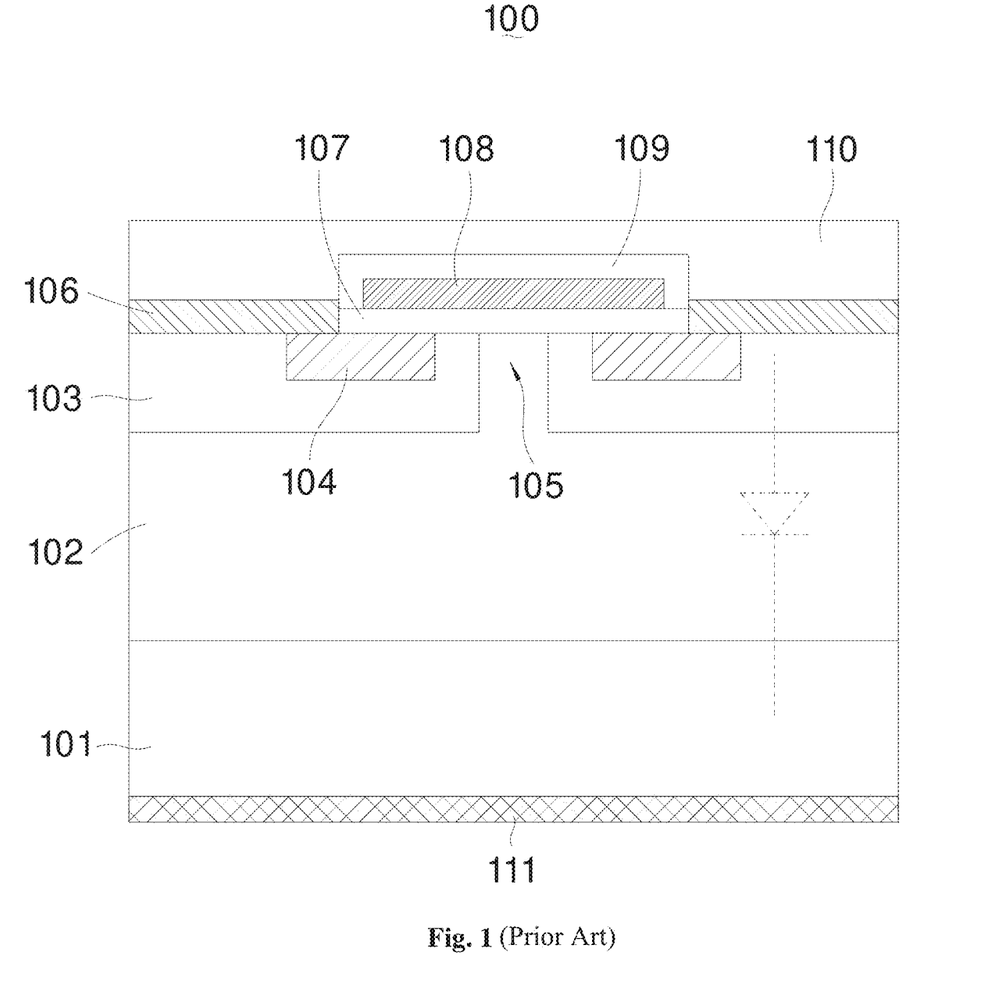
FIG. 1 is a schematic diagram of a cross section of a cellular structure of a traditional silicon carbide MOSFET device.

A traditional MOSFET device, as shown in FIG. 1, further has a parasitic body PiN diode in its cellular structure in addition to a MOS structure. In order to suppress turn-on of the PIN diode in the silicon carbide MOSFET device, a relatively effective method is to use the SBD in an anti-parallel manner with the MOSFET device as its free-wheel diode. However, using the MOSFET device and the SBD in the anti-parallel manner at the chip level will increase the packaging cost of a power module and increase the stray inductance caused by additional bonding wires, resulting in a decrease in the electrical performance of the power module.

SUMMARY OF THE INVENTION

Directed against the above problems, the disclosure provides a cellular structure of a silicon carbide MOSFET device, and a silicon carbide MOSFET device.

In a first aspect, the disclosure provides a cellular structure of a silicon carbide MOSFET device, including:
a first conductivity type silicon carbide substrate;
a first conductivity type drift layer, which is located above the substrate;
a second conductivity type well region, which is located on two sides of the cellular structure and within a surface of the drift layer;
a first conductivity type source region, which is located within a surface of the well region;
a gate structure, which is located at a center of the cellular structure and is in contact with the source region, the well region, and the drift layer, the gate structure including a gate and a gate insulation layer for isolating the gate from the source region, the well region, and the drift layer;
a source metal layer, which is located above the source region and forms ohmic contact with the source region;
a side trench, which is provided on each of the two sides of the cellular structure and in an area of the drift layer not covered by the well region, the side trench being adjacent to the well region ut being not in contact with the source region; and
a Schottky metal layer, which is provided in the side trench and forms Schottky contact with the drift layer below the side trench.

According to an embodiment of the disclosure, preferably, the side trench has a depth that is less than a depth of the well region.

According to an embodiment of the disclosure, preferably, the cellular structure further includes a second conductivity type enhancement region. which is provided in the well region farther from the center of the cellular structure than the source region and side by side with the source region, the enhancement region having an ion doping concentration that is greater than an ion doping concentration of the well region; and
the source metal layer is located above both the source region and the enhancement region.

According to an embodiment of the disclosure, preferably, the enhancement region has a depth that is greater than the depth of the well region, so that a bottom of the enhancement region is able to contact with the drift layer below the well region.

According to an embodiment of the disclosure, preferably,
a side, close to the center of the cellular structure, of the surface of the well region is not completely covered by the source region;
the gate structure includes a polycrystalline silicon planar gate structure;
a gate insulation layer of the planar gate structure is located above the source region, the well region, and the drift layer, and is in contact with the source region, the well region, and the drift layer at the same time; and
a gate of the planar gate structure is provided above the gate insulation layer.

According to an embodiment of the disclosure, preferably,
a side, close to the center of the cellular structure, of the surface of the well region is completely covered by the source region;
the gate structure includes a polycrystalline silicon trench gate structure;
a gate trench abutting against the well region is provided downwardly in a surface of the drift layer at the center of the cellular structure, the trench gate having a depth that is greater than a depth of the well region, and a sidewall of the gate trench being in contact with the source region, the well region, and the drift layer; and
a gate insulation layer of the trench gate structure is provided at a bottom and walls of the gate trench, and is used to isolate a gate of the trench gate structure provided in the gate trench from the source region, the well region, and the drift layer.

According to an embodiment of the disclosure, preferably, the Schottky metal layer is in contact with the source metal layer, so as to form an electrical connection.

According to an embodiment of the disclosure, preferably, the Schottky metal layer and the source metal layer are isolated from each other and form an electrical connection via a source compacted block metal layer located above them.

According to an embodiment of the disclosure, preferably, the gate is isolated from the source metal layer, the source compacted block metal layer, and the Schottky metal layer via an interlayer dielectric layer.

In a second aspect, the disclosure provides a silicon carbide MOSFET device, including several cellular structures of a silicon carbide MOSFET device according to the first aspect.

By using the above solutions, at least the following effects can be achieved.

The disclosure provides a cellular structure of a silicon carbide MOSFET device, and a silicon carbide MOSFET device. By integrating an SBD in a cell of a SiC MOSFET device so that the SBD and the MOSFET share a sectional area of a chip, the use efficiency of an area of the chip is improved, which further improves the overall power density of the chip and reduces the packaging cost of a power module. Meanwhile, integrating the SBD in a shallow groove of the chip can also reduce the on-state resistance of the SBD, suppress turn-on of a parasitic body PiN diode, mitigate the bipolar degradation effect of the silicon carbide device, improve the reliability of the chip, and optimize a ratio of an area of a SBD portion to an area of a MOSFET portion.

BRIEF DESCRIPTION OF THE DRAWINGS

The drawings are used to provide further understanding of the disclosure, constitute part of the description, are used to explain the disclosure in conjunction with the following specific embodiments, but do not constitute any limitation on the disclosure. In the drawings.

DETAILED DESCRIPTION OF THE EMBODIMENTS

Embodiments of the disclosure will be described in detail with reference to the accompanying drawings in conjunction with the embodiments, through which the implementation process of how the disclosure use the technical means to solve the technical problem and achieve the corresponding technical effect can be fully understood, and the disclosure can be carried out accordingly. As long as there is no conflict, respective embodiments in the disclosure and various features in respective embodiments may be combined with each other, and technical solutions formed shall all fall into the protection scope of the disclosure. In the drawings, for clarity, sizes of layers and regions as well we relative dimensions may be exaggerated. Throughout the drawings, same reference numerals indicate same elements.

It should be understood that, although terms such as "first", "second", "third" and the like are used to describe various elements, components, regions, layers and/or parts, these elements, components, regions, layers and/or parts should not be limited by these terms. These terms are only used to distinguish one element, component, region, layer and/or part from another element, component, region, layer and/or part. Therefore, without departing from the teaching of the disclosure, a first element, component, region, layer and/or part discussed hereinafter may be indicated as a second element, component, region, layer and/or part.

It should be understood that, spatial relationship terms such as "above", "located above", "below", "located below", and the like can be used for the convenience of description in order to describe a relationship between one element or feature and another element or feature illustrated in the drawings. It should be understood that, in addition to an orientation illustrated in the drawings, a spatial relationship term means to further include a different orientation of a device during use and operation. For example, if a device in the drawings is upside-down, an element or feature that is originally described as being "below" another element or feature will be oriented to be "above" another element or feature. Therefore, exemplary terms of "below" and "under" may include two orientations, i.e., "upper" and "lower". The device may be orientated otherwise (rotated by 90 degrees or oriented in other ways), and spatial relationship terms used herein should be explained accordingly.

Terms used herein are merely for describing specific embodiments and do not limit the disclosure. When used, singular forms such as "a/an", "one", and "the" also mean to include plural forms, unless other forms are explicitly indicated in the context. It should be further understood that, when used in the description, the term(s) of "comprise" and/or "include" determine(s) the presence of a feature, integer, step, operation, element, and/or part, but do(es) not exclude the presence or addition of one or more other features integers, steps, operations, elements, and/or parts. When used herein, the term of "and/or" includes any of listed items and all combinations.

Embodiments of the disclosure are described with reference to cross sections of schematic diagrams of ideal embodiments (and intermediate structures) of the disclosure. In this way, variations from illustrated shapes due to, for example, the manufacturing technique and/or the tolerance may be anticipated. Therefore, embodiments of the disclosure should not be limited by particular shapes of regions illustrated herein, but include deviations of shapes resulted from, for example, manufacturing. For example, an injection region shown as a rectangle normally has a round or curved feature and/or an injection concentration gradient at an edge thereof, rather than a binary change from the injection region to a non-injection region. Likewise, a buried region formed by injection may result in some injection in a region between the buried region and a surface through which the injection passes. Therefore, regions shown in the drawings are substantively schematic, and their shapes do not mean to show actual shapes of regions of the device and do not mean to limit the scope of the disclosure.

In order to thoroughly understand the disclosure, detailed structures and steps will be put forward in the following description so as to explain technical solutions of the disclosure. Preferred embodiments of the disclosure are described in detail as follows, but the disclosure may have other embodiments in addition to the detailed description.

Embodiment One

Figure 2:
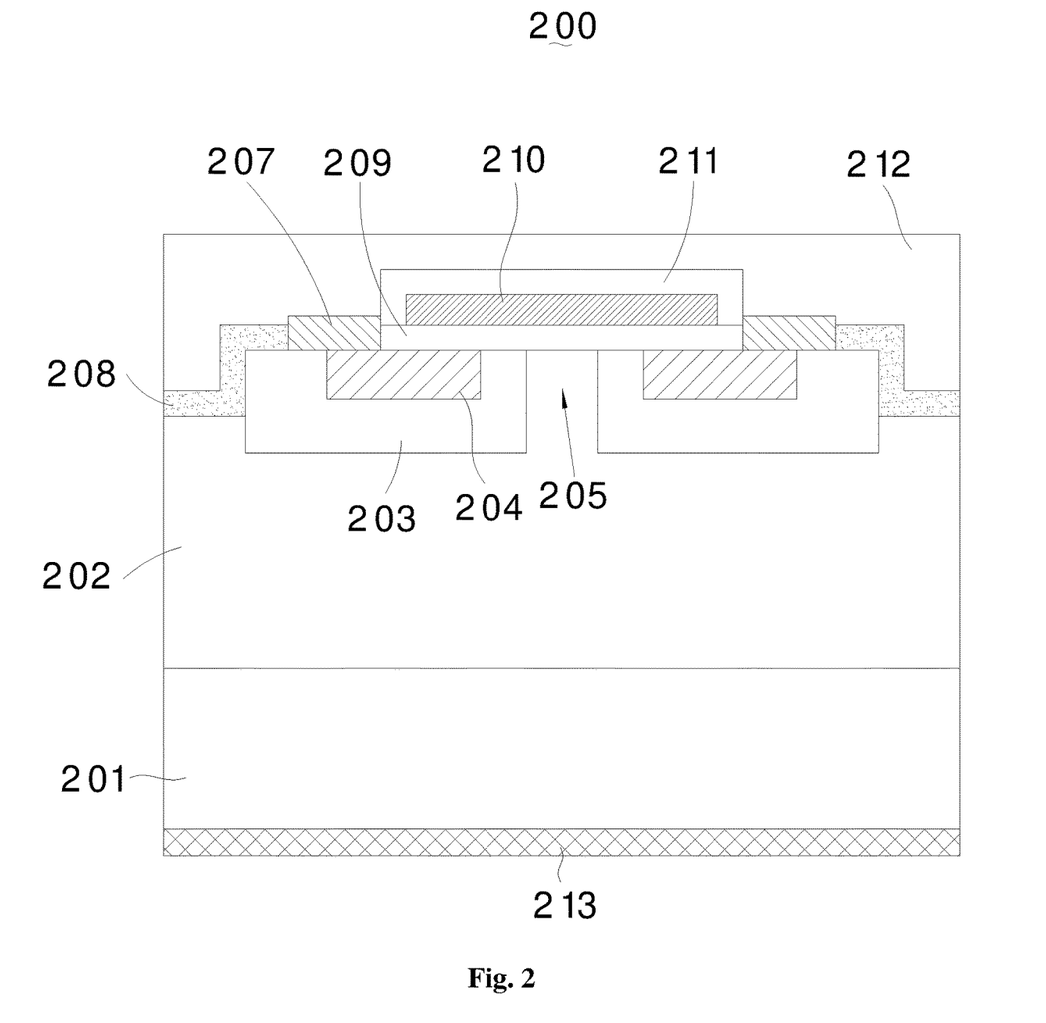
FIG. 2 is a schematic diagram of a cross section of a cellular structure of a silicon carbide MOSFET device having a planar gate structure according to an embodiment of the disclosure.

As shown in FIG. 2, the embodiment provides a cellular structure 200 of a silicon carbide MOSFET device having a planar gate structure, which includes: a SiC substrate 201, a drift layer 202, a well region 203, a source region 204, a source metal layer 207, a Schottky metal layer 208, a gate insulation layer 209, a gate 210, an interlayer dielectric layer 211, a source compacted block metal layer 212, and a drain metal layer 213.

Exemplarily, the SiC substrate 201 is a first conductivity type SiC substrate.

The drift layer 202 is a first conductivity type drift layer, and is located above the SiC substrate 201. A doping concentration and a thickness of the drift layer 202 are adjusted according to different withstand voltage capabilities of a chip.

The well region 203 is a second conductivity type well region, is located on two sides of the cellular structure 200 and within the drift layer 202, and has an upper surface which is flush with an upper surface of the drift layer 202.

The source region 204 is a first conductivity type source region, is located in the well region 203, and has an upper surface which is flush with the upper surface of the drift layer 202. The source region 204 has a width that is less than a width of the well region 203, and there is a width difference between the well region 203 and each of two ends of the source region 204. A channel (not indicated in the drawing) is formed between the width difference close to a center of the cellular structure 200 and the gate insulation layer 209, and an area between two adjacent channels is a JFET region 205.

A side trench (not indicated in the drawing) is provided on each of the two sides of the cellular structure 200 and in an area of the drift layer 202 not covered by the well region 203, and the side trench is adjacent to the well region 203 but is not in contact with the source region 204. The side trench has a depth that is less than a depth of the well region 203.

The Schottky metal layer 208 is provided in the side trench, and forms Schottky contact with the drift layer 202 below the side trench, so as to form a Schottky barrier diode (SBD). The Schottky metal layer 208 may be a metal such as titanium, nickel, and the like.

The source metal layer 207 is located above the source region 204, and forms ohmic contact with the source region 204. The source metal layer 207 cannot be in contact with the drift layer 202. The source metal layer 207 may be formed of a metal having low contact electrical resistivity, such as aluminum.

Figure 3:
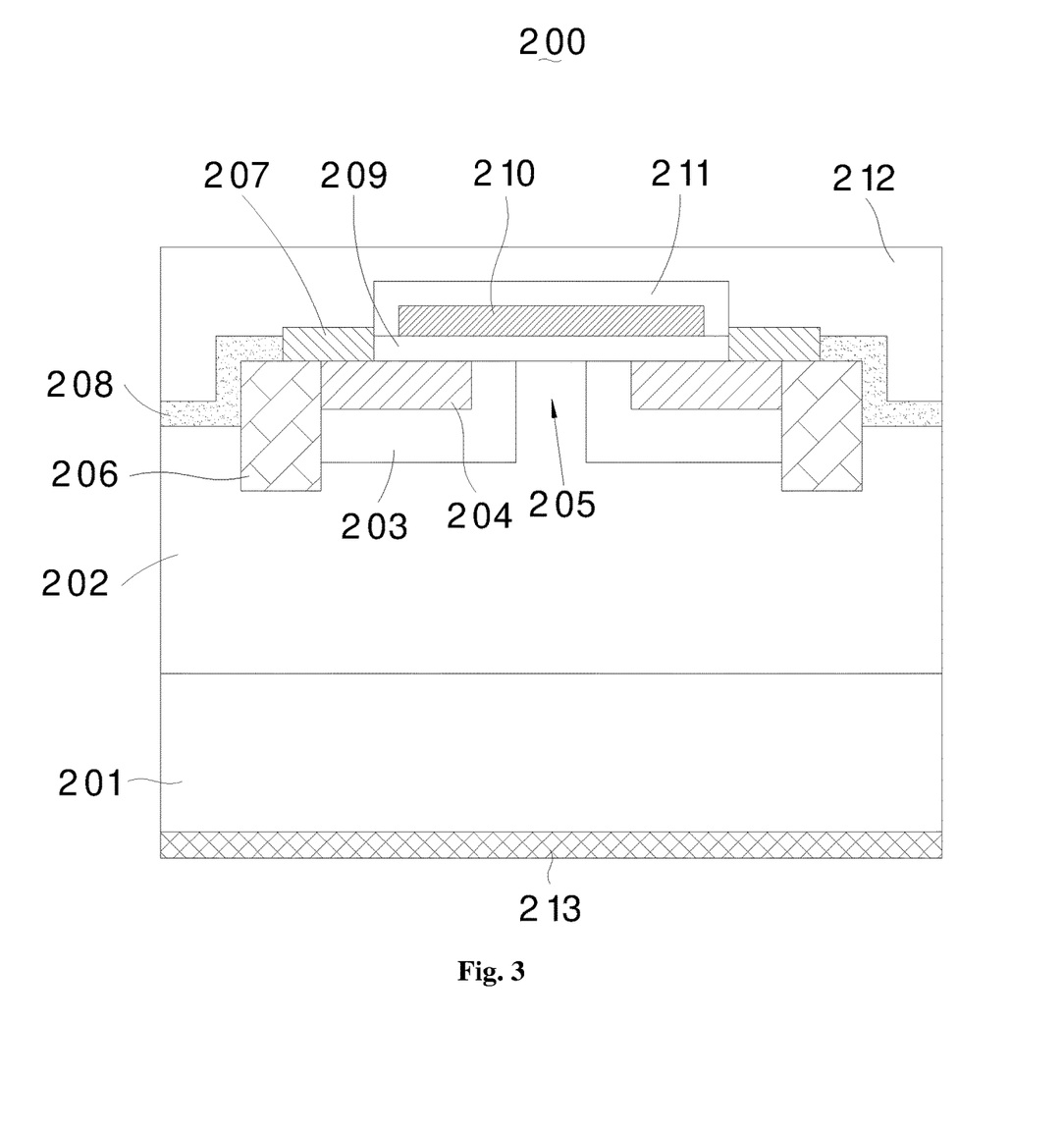
FIG. 3 is a schematic diagram of another cross section of the cellular structure of the silicon carbide MOSFET device having the planar gate structure according to the embodiment of the disclosure.

In the embodiment, as shown in FIG. 3, the cellular structure 200 may further include a second conductivity type enhancement region 206. The enhancement region 206 is provided in the well region 203 farther from the center of the cellular structure than the source region 204 and side by side with the source region 204. The enhancement region 206 has an ion doping concentration that is greater than an ion doping concentration of the well region 203. The enhancement region 206 has a depth that is greater than the depth of the well region 203, so that a bottom of the enhancement region 206 is able to contact with the drift layer 202 below the well region 203. At this time, the source metal layer 207 is located above both the source region 204 and the enhancement region 206, and the depth of the side trench is less than the depth of the well region 203 and is greater than one fifth of the depth of the enhancement region 206. This cellular structure 200 can both reduce the influence of a parasitic BJT in the MOSFET and protect a Schottky junction when the SBD is reverse-biased so as to reduce a reverse bias leakage current of the SBD. Meanwhile, the enhancement region 206 which is located at two ends of the chip may also be used as a field limiting ring of a chip terminal, so that the manufacturing cost of the chip can be reduced.

Figure 4:
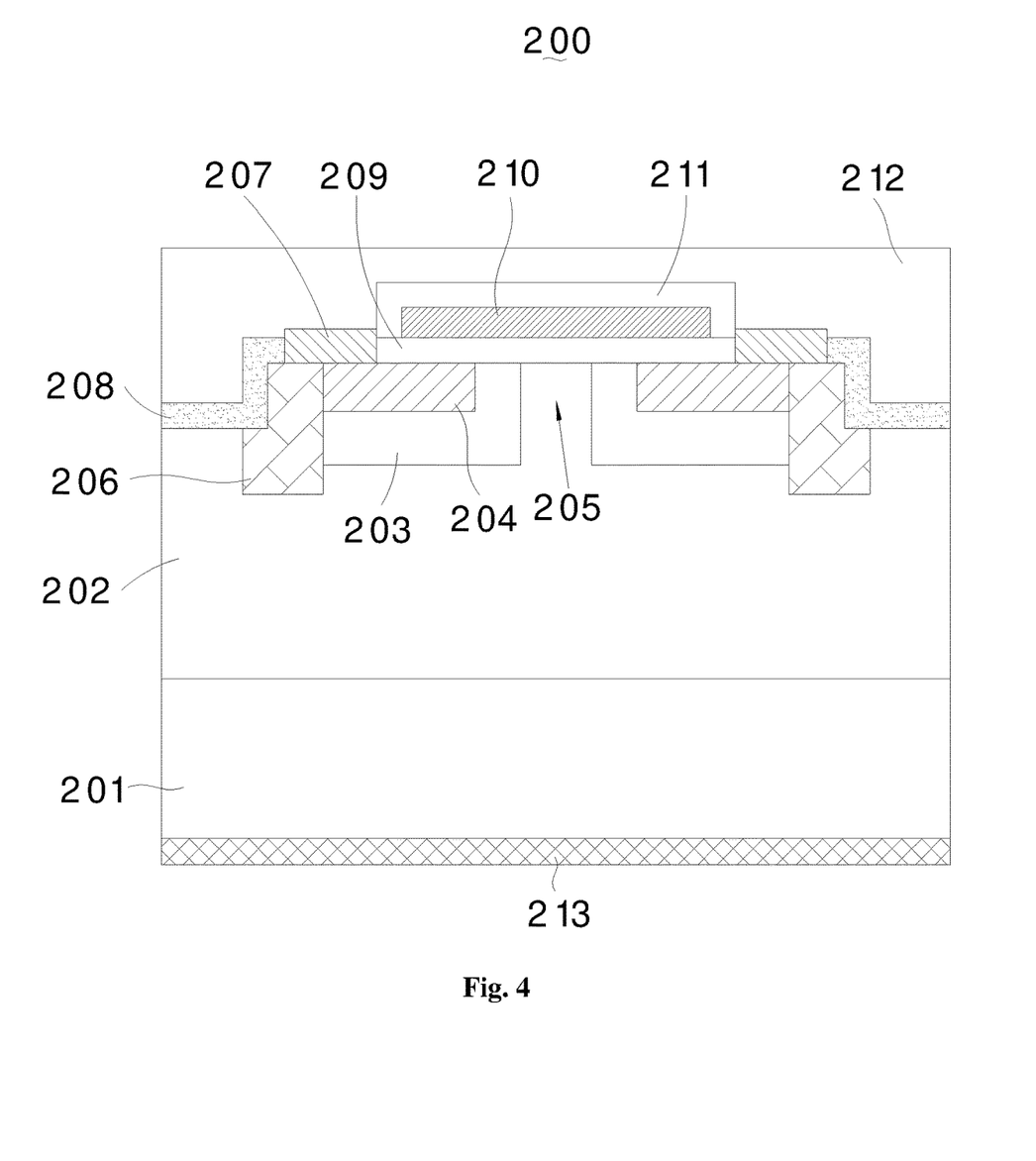
FIG. 4 is a schematic diagram of another cross section of the cellular structure of the silicon carbide MOSFET device having the planar gate structure according to the embodiment of the disclosure.

In this structure, as shown in FIG. 3, a sidewall of the side trench may be located at an edge of the enhancement region 206. As shown in FIG. 4, a sidewall of an etched trench may also be located inside the enhancement region 206. That is, the side trench may extend into the enhancement region 206.

Figure 5:
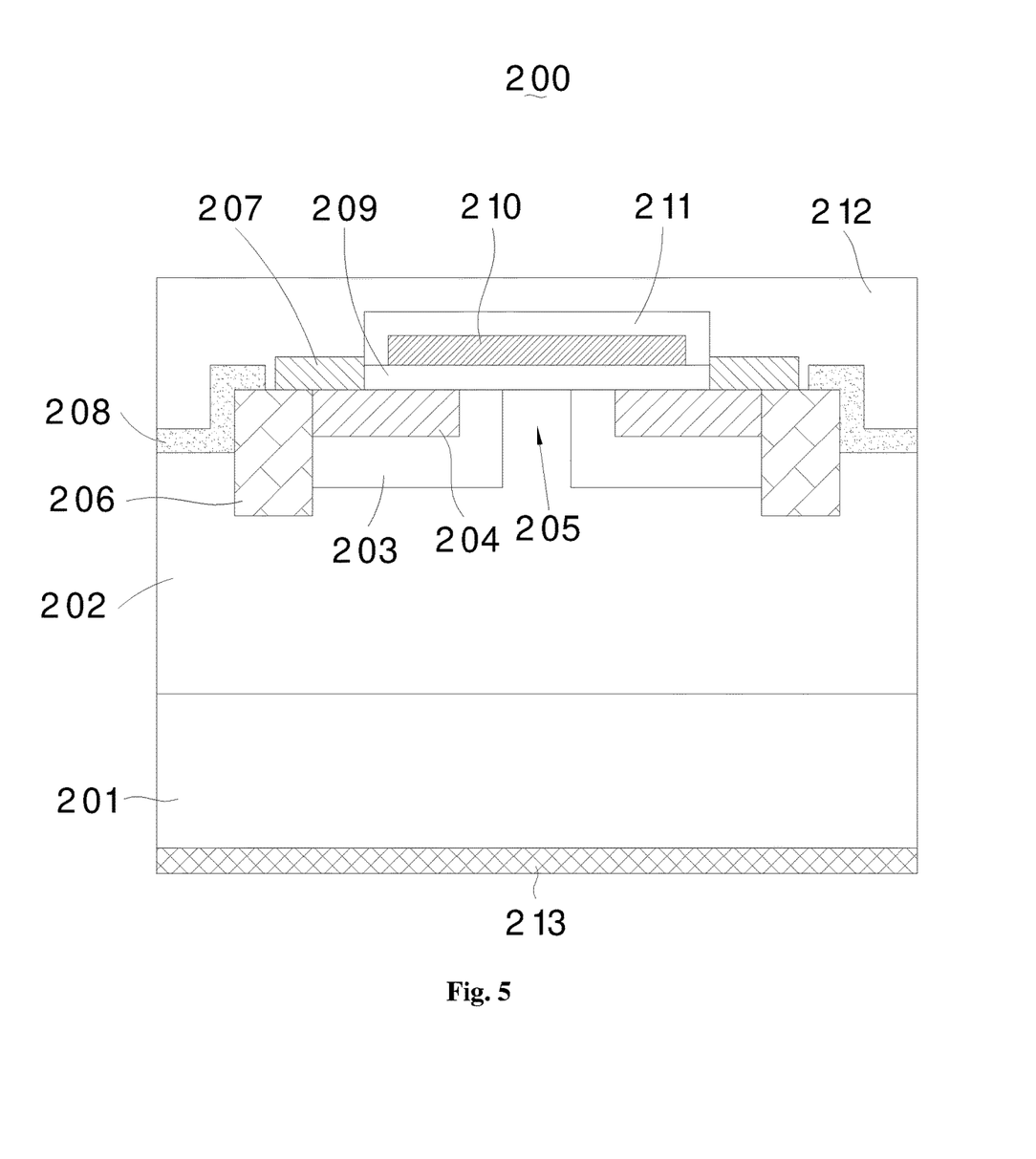
FIG. 5 is a schematic diagram of another cross section of the cellular structure of the silicon carbide MOSFET device having the planar gate structure according to the embodiment of the disclosure.

In the embodiment, as shown in FIG. 3, the Schottky metal layer 208 may be in contact with the source metal layer 207, or even located above the source metal layer 207 so as to form an electrical connection. As shown in FIG. 5, it may also be chosen that the Schottky metal layer and the source metal layer are isolated from each other and connected via the source compacted block metal layer 212.

The planar gate is located at the center of the cellular structure 200, and includes the gate insulation layer 209 and the gate 210.

The gate insulation layer 209 is located above the drift layer 202, is in contact with the source region 204, the well region 203, and the drift layer 202 at the same time, and is used to isolate the gate 210 from the source region 204, the well region 203, and the drift layer 202. A channel (not indicated in the drawing) is formed between the gate insulation layer 209 and the well region 203, and the gate insulation layer 209 has a thickness that is greater than 50 nm. The gate 210 is located above the gate insulation layer 209, and is a polycrystalline silicon gate.

The interlayer dielectric layer 211 is located above the gate 210, and is used to isolate the gate 210 from the source metal layer 207, the source compacted block metal layer 212, and the Schottky metal layer 208.

The source compacted block metal layer 212 is located above the interlayer dielectric layer 211, covers the interlayer dielectric layer 211, the source metal layer 207, and the Schottky metal layer 208 at the same time, and is electrically connected with the source metal layer 207 and the Schottky metal layer 208.

The drain metal layer 213 is located below the SiC substrate 201, and forms ohmic contact with the SiC substrate 201.

Correspondingly, a first conductivity type and a second conductivity type are opposite. For example, when the first conductivity type is N type, the second conductivity type is P type; and when the first conductivity type is the P type, the second conductivity type is the N type.

In the embodiment, by integrating an SBD in a cell of a SiC MOSFET device having a planar gate structure so that the SBD and the MOSFET share a sectional area of a chip, the use efficiency of an area of the chip is improved, which further improves the overall power density of the chip and reduces the packaging cost of a module. Meanwhile, integrating the SBD in a shallow groove of the chip can also reduce the on-state resistance of the SBD, suppress turn-on of a parasitic body PiN diode, mitigate the bipolar degradation effect of the silicon carbide device, improve the reliability of the chip, and optimize a ratio of an area of a SBD portion to an area of a MOSFET portion.

Embodiment Two

Figure 6:
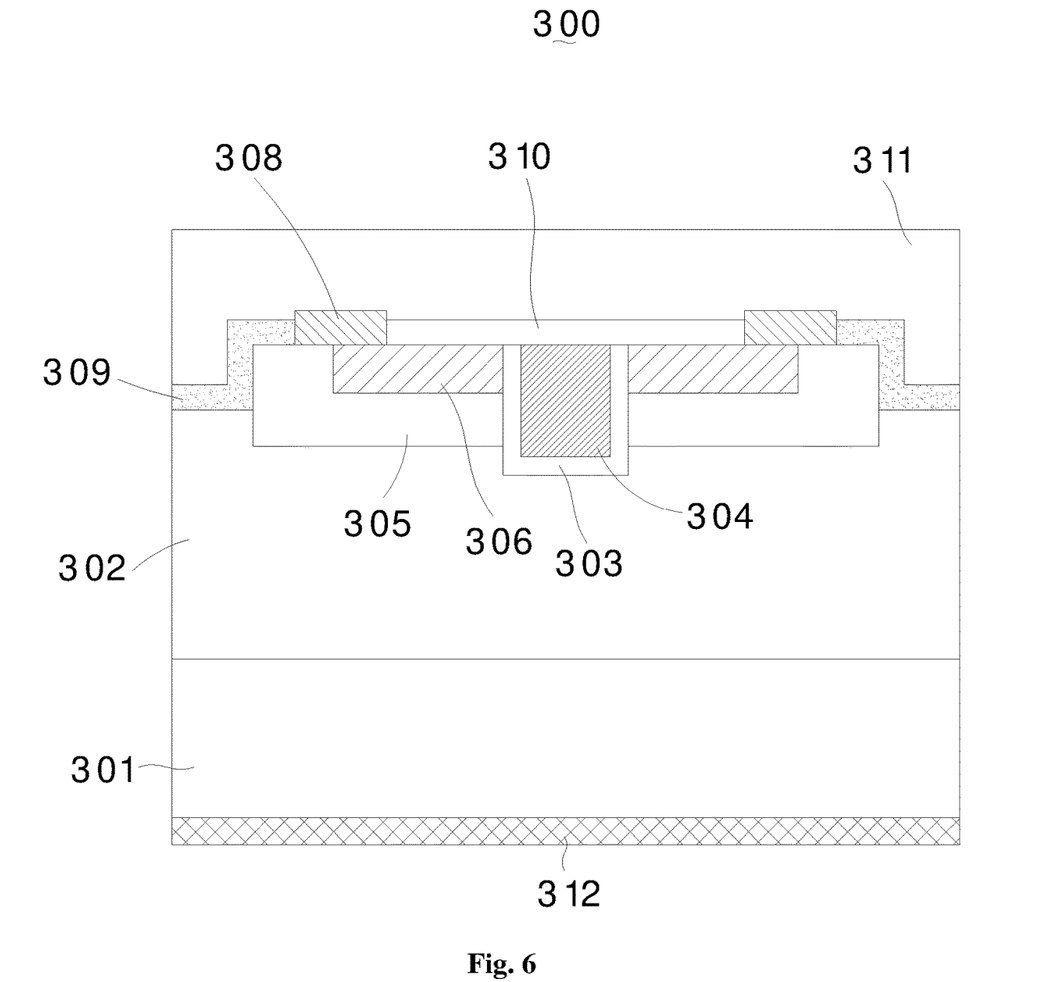
FIG. 6 is a schematic diagram of a cross section of a cellular structure of a silicon carbide MOSFET device having a trench gate structure according to an embodiment of the disclosure.

As shown in FIG. 6, the embodiment provides another cellular structure 300 of a silicon carbide MOSFET device, which includes a SiC substrate 301, a drift layer 302, a gate insulation layer 303, a gate 304, a well region 305, a source region 306, a source metal layer 308, a Schottky metal layer 309, an interlayer dielectric layer 310, a source compacted block metal layer 311, and a drain metal layer 312.

Exemplarily, the SiC substrate 301 is a first conductivity type SiC substrate.

The drift layer 302 is a first conductivity type drift layer, and is located above the SiC substrate 301. A doping concentration and a thickness of the drift layer 302 are adjusted according to different withstand voltage capabilities of a chip.

The cellular structure 300 is provided at a center thereof with a trench gate structure, which includes the gate insulation layer 303 and the gate 304. At the center of the cellular structure 300, a gate trench (not indicated in the drawing) abutting against the well region 305 is provided downwardly in a surface of the drift layer 302. The trench gate has a depth that is greater than a depth of the well region 305, and a sidewall of the gate trench is in contact with the source region 306, the well region 305, and the drift layer 302.

The gate insulation layer 303 is provided at a bottom and walls of the gate trench, and is used to isolate the polycrystalline silicon gate 304 provided in the gate trench from the source region 306, the well region 305, and the drift layer 302. The gate insulation layer 303 has a thickness that is greater than 50 nm.

The well region 305 is a second conductivity type well region, is located on two sides of the cellular structure 300 and within the drift layer 302, and has an upper surface which is flush with an upper surface of the drift layer 302. An end, close to the center of the cellular structure 300, of well region 305 is in contact with the gate insulation layer 303, so as to form a channel (not indicated in the drawing) between the well region 305 and the gate insulation layer 303.

The source region 306 is a first conductivity type source region, is located in the well region 305, and has an upper surface which is flush with the upper surface of the drift layer 302. The source region 306 has a width that is less than a width of the well region 305, and an end, close to the center of the cellular structure 300, of the source region 306 is in contact with the gate insulation layer 303.

A side trench (not indicated in the drawing) is provided on each of two sides of the cellular structure 300 and in an area of the drift layer 302 not covered by the well region 305, and the side trench is adjacent to the well region 305 but is not in contact with the source region 306. The side trench has a depth that is less than a depth of the well region 305.

The Schottky metal layer 309 is provided in the side trench, and forms Schottky contact with the drift layer 302 below the side trench, so as to form a Schottky barrier diode (SBD). The Schottky metal layer 309 may be a metal such as titanium, nickel, and the like.

The source metal layer 308 is located above the source region 306, and forms ohmic contact with the source region 306. The source metal layer 308 cannot be in contact with the drift layer 302. The source metal layer 308 may be formed of a metal having low contact electrical resistivity, such as aluminum.

Figure 7:
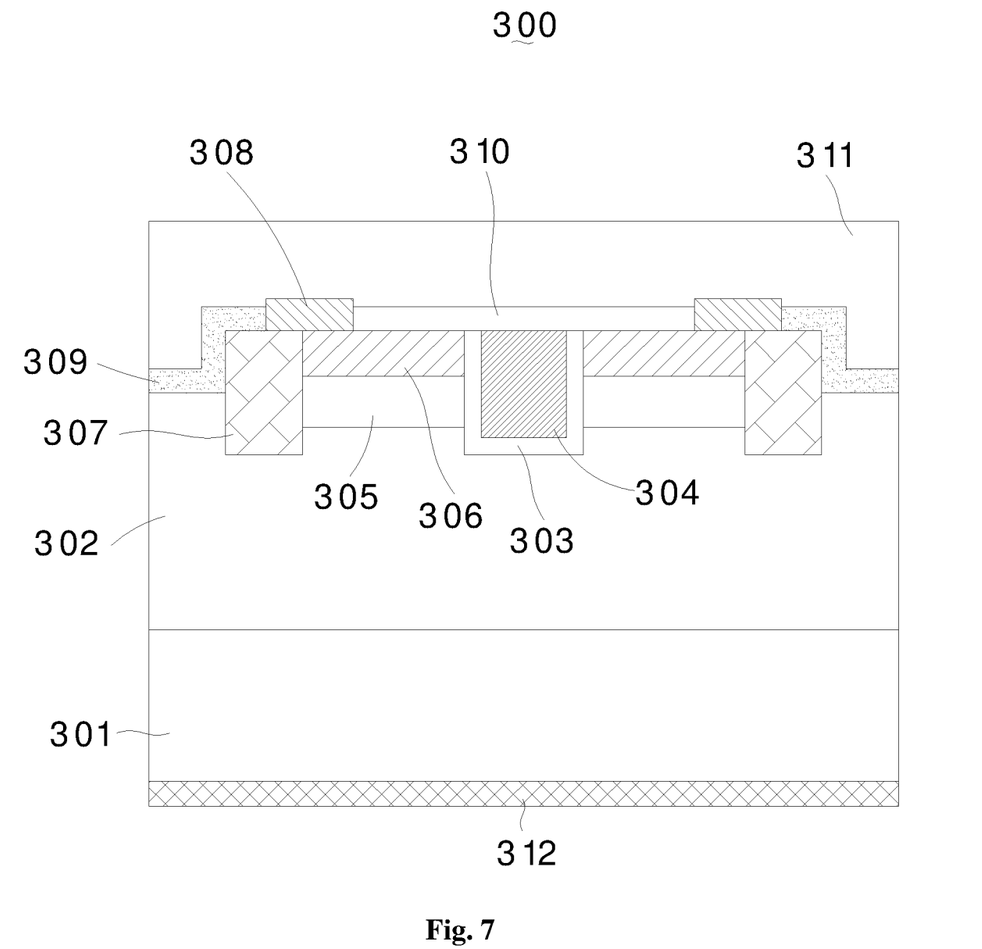
FIG. 7 is a schematic diagram of another cross section of the cellular structure of the silicon carbide MOSFET device having the trench gate structure according to the embodiment of the disclosure.

In the embodiment, as shown in FIG. 7, the cellular structure 300 may further include a second conductivity type enhancement region 307. The enhancement region 307 is provided in the well region 305 farther from the center of the cellular structure than the source region 306 and side by side with the source region 306. The enhancement region 307 has an ion doping concentration that is greater than an ion doping concentration of the well region 305. The enhancement region 307 has a depth that is greater than the depth of the well region 305, so that a bottom of the enhancement region 307 is able to contact with the drift layer 302 below the well region 305. At this time, the source metal layer 311 is located above both the source region 306 and the enhancement region 307, and the depth of the side trench is less than the depth of the well region 305 and is greater than one fifth of the depth of the enhancement region 307. This cellular structure 300 can both reduce the influence of a parasitic BJT in the MOSFET and protect a Schottky junction when the SBD is reverse-biased so as to reduce a reverse bias leakage current of the SBD. Meanwhile, the enhancement region 307 which is located at two ends of the chip may also be used as a field limiting ring of a chip terminal, so that the manufacturing cost of the chip can be reduced.

Figure 8:
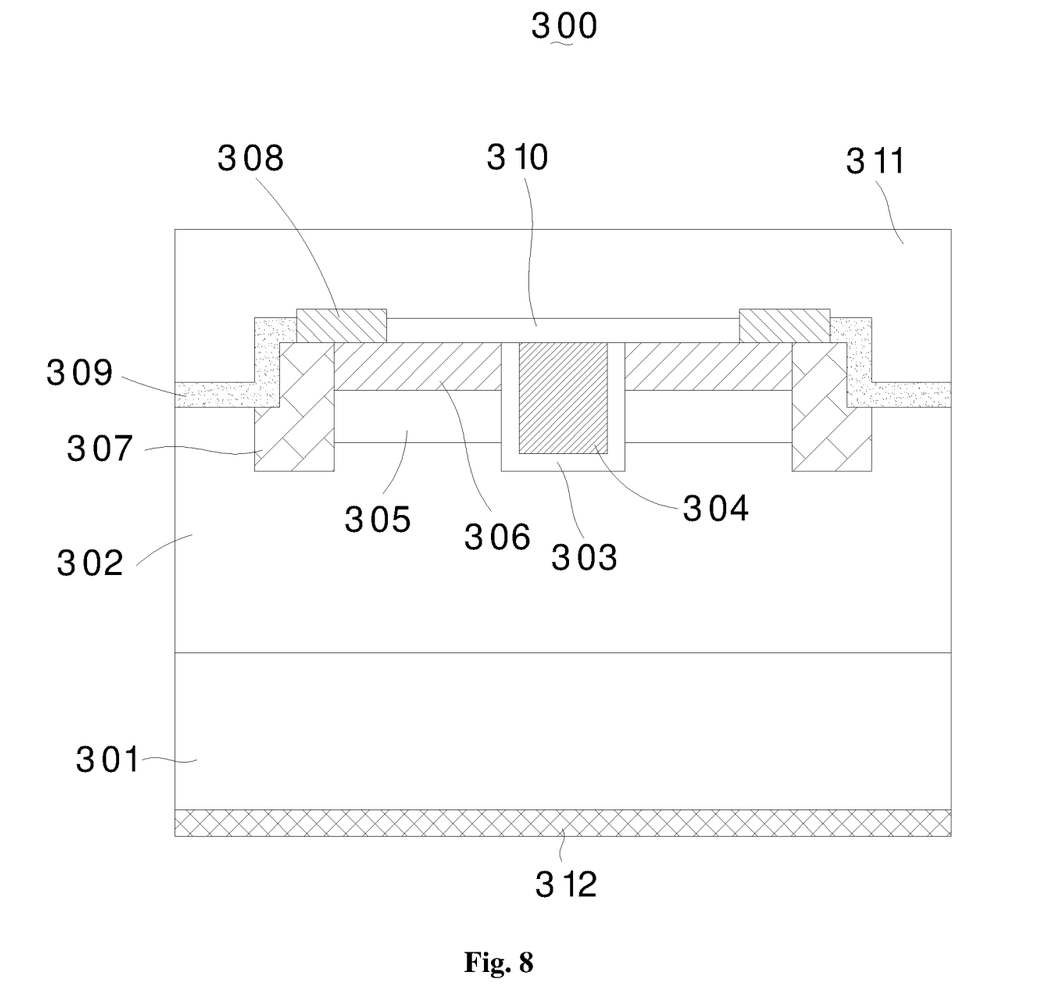
FIG. 8 is a schematic diagram of another cross section of the cellular structure of the silicon carbide MOSFET device having the trench gate structure according to the embodiment of the disclosure.

In this structure, as shown in FIG. 7, a sidewall of the side trench may be located at an edge of the enhancement region 307. As shown in FIG. 8, a sidewall of the side trench may also be located inside the enhancement region 307. That is, the side trench may extend into the enhancement region 307.

Figure 9:
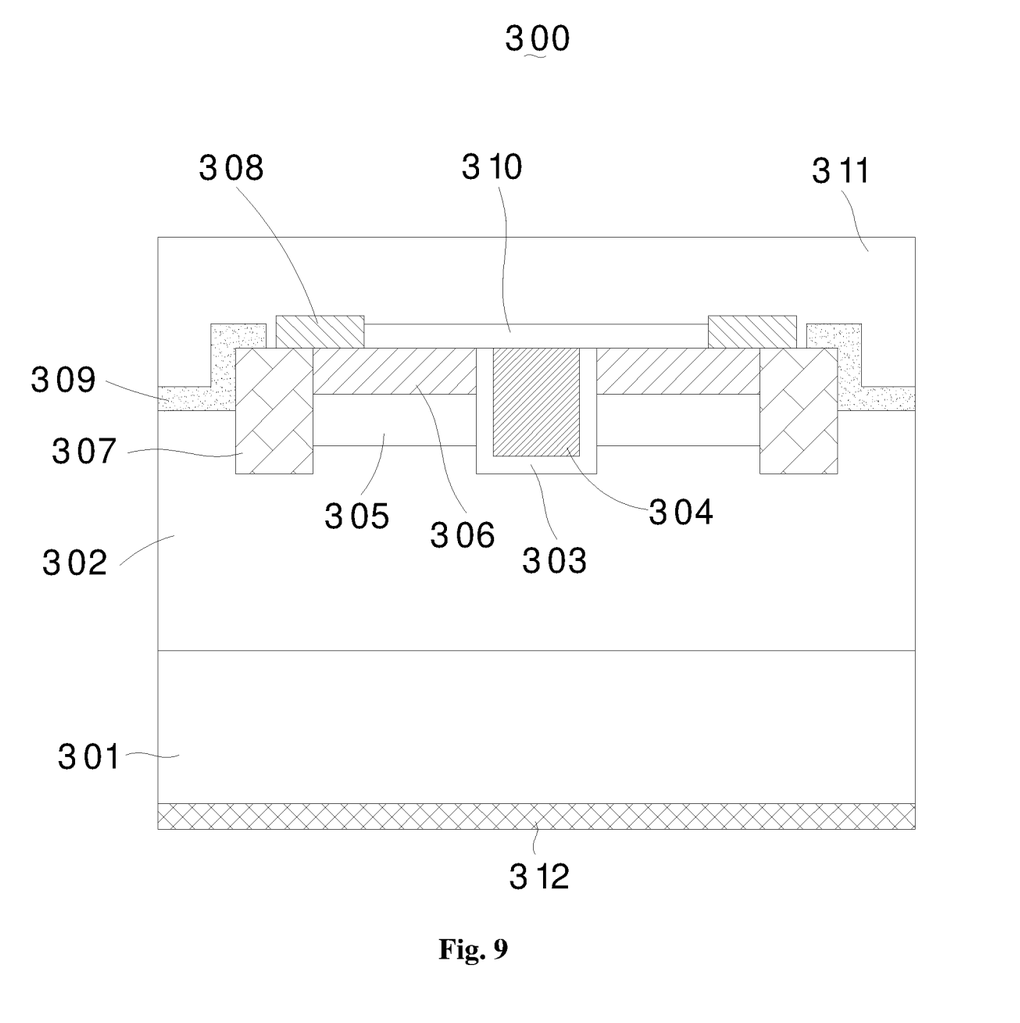
FIG. 9 is a schematic diagram of another cross section of the cellular structure of the silicon carbide MOSFET device having the trench gate structure according to the embodiment of the disclosure.

In the embodiment, as shown in FIG. 7, the Schottky metal layer 309 may be in contact with the source metal layer 308, or even located above the source metal layer 308, so as to form an electrical connection. As shown in FIG. 9, it may also be chosen that the Schottky metal layer and the source metal layer are isolated from each other and connected via the source compacted block metal layer 311.

The interlayer dielectric layer 310 is located above the drift layer 302, and is used to isolate the gate 304 from the source metal layer 308, the source compacted block metal layer 311, and the Schottky metal layer 309.

The source compacted block metal layer 311 is located above the interlayer dielectric layer 310, covers the interlayer dielectric layer 310, the source metal layer 308, and the Schottky metal layer 309 at the same time, and is electrically connected with the source metal layer 308 and the Schottky metal layer 309.

The drain metal layer 312 is located below the SiC substrate 301, and forms ohmic contact with the SiC substrate 301.

Correspondingly, a first conductivity type and a second conductivity type are opposite. For example, when the first conductivity type is N type, the second conductivity type is P type; and when the first conductivity type is the P type, the second conductivity type is the N type.

In the embodiment, by integrating an SBD in a cell of a SiC MOSFET device having a trench gate structure so that the SBD and the MOSFET share a sectional area of a chip, the use efficiency of an area of the chip is improved, which further improves the overall power density of the chip and reduces the packaging cost of a module. Meanwhile, integrating the SBD in a shallow groove of the chip can also reduce the on-state resistance of the SBD, suppress turn-on of a parasitic body PiN diode, mitigate the bipolar degradation effect of the silicon carbide device, improve the reliability of the chip, and optimize a ratio of an area of a SBD portion to an area of a MOSFET portion.

Embodiment Three

On the basis of Embodiment One, this embodiment provides a cellular structure 200 of an N-type silicon carbide MOSFET device having a planar gate structure. As shown in FIG. 2, the cellular structure 200 includes: an N-type substrate 201, an N-type drift layer 202, a P well region 203, an N+ source region 204, a source metal layer 207, a Schottky metal layer 208, a gate insulation layer 209, a gate 210, an interlayer dielectric layer 211, a source compacted block metal layer 212, and a drain metal layer 213.

As shown in FIG. 3, a P+ enhancement region 206 may further be included.

Positional relationships among the above respective parts are the same as those in Embodiment One, and details will not be repeated in the embodiment.

Specifically, the N-type substrate 201 has an ion doping concentration of $1E18$ cm$^{-3}$ to $1E19$ cm$^{-3}$.

The N-type drift layer 202 has an ion doping concentration in a range of $1E14$ cm$^{-3}$ to $5E16$ cm$^{-3}$, and specifically the ion doping concentration are optimized according to withstand voltage capabilities of a chip.

The P well region 203 has an ion doping concentration in a range of $1E16$ cm$^{-3}$ to $5E18$ cm$^{-3}$, and has a depth of 1 um.

The N+ source region 204 has an ion doping concentration of $1E19$ cm$^{-3}$.

The P+ enhancement region 206 has an ion doping concentration that is greater than the ion doping concentration of the P well region 203 and is greater than $1E18$ cm$^{-3}$, and has a depth that is greater than 1 um.

Specifically, the N-type SiC substrate 201 has an ion doping concentration of $1E18$ cm$^{-3}$ to $1E19$ cm$^{-3}$.

The gate 210 is an N-type polycrystalline silicon gate, and has an ion doping concentration that is greater than $1E18$ cm$^{-3}$.

In the embodiment, by integrating an SBD in a cell of an N-type SiC MOSFET device having a planar gate structure so that the SBD and the MOSFET share a sectional area of a chip, the use efficiency of an area of the chip is improved, which further improves the overall power density of the chip and reduces the packaging cost of a module. Meanwhile, integrating the SBD in a shallow groove of the chip can also reduce the on-state resistance of the SBD, suppress turn-on of a parasitic body PiN diode, mitigate the bipolar degradation effect of the silicon carbide device, improve the reliability of the chip, and optimize a ratio of an area of a SBD portion to an area of a MOSFET portion.

The above embodiments are only preferred embodiments of the disclosure, and are not intended to limit the disclosure. For those skilled in the art, the disclosure can have various modifications and changes. Any amendment, equivalent replacement, improvement and the like made within the spirit and principle of the disclosure shall all fall into the protection scope of the disclosure. Although the embodiments of the disclosure are disclosed as above, the embodiments are only used for better understanding of the disclosure, rather than for limiting the disclosure. Without departing from the spirit and scope of the disclosure, any skilled person in the technical field of the disclosure can make any amendment and change on the implementation form and details, but the protection scope of the disclosure shall still be confined to the scope defined in the appended claims.

The invention claimed is:

1. A cellular structure of a silicon carbide MOSFET device, comprising:
    a first conductivity type silicon carbide substrate;
    a first conductivity type drift layer, which is located above the substrate;
    a second conductivity type well region, which is located on two sides of the cellular structure and within a surface of the drift layer;
    a first conductivity type source region, which is located within a surface of the well region;
    a gate structure, which is located at a center of the cellular structure and is in contact with the source region, the well region, and the drift layer, wherein the gate structure comprises a gate and a gate insulation layer for isolating the gate from the source region, the well region, and the drift layer;
    a source metal layer, which is located above the source region and forms ohmic contact with the source region;
    side trenches, which are provided on the two sides of the cellular structure, away from the center of the cellular structure, and formed downward from an area of the drift layer not covered by the well region, wherein each of the side trenches is adjacent to the well region but is not in contact with the source region;
    a second conductivity type enhancement region, which is provided in the well region farther from the center of the cellular structure than the source region and side by side with the source region, and
    a Schottky metal layer, which is provided in each of the side trenches and forms Schottky contact with the drift layer below the side trenches,
    wherein each of the side trenches has a depth downward from an area of the drift layer not covered by the well region, the depth is less than a depth of the well region and is less than a depth of the enhancement region and greater than one fifth of the depth of the enhancement region so that the enhancement region which is located at two ends of a chip serves as a field limiting ring for terminals of the chip.

2. The cellular structure of the silicon carbide MOSFET device according to claim 1, wherein the enhancement region has an ion doping concentration that is greater than an ion doping concentration of the well region; and
    the source metal layer is located above both the source region and the enhancement region.

3. The cellular structure of the silicon carbide MOSFET device according to claim 1, wherein the enhancement region has a depth that is greater than the depth of the well region, so that a bottom of the enhancement region is able to contact with the drift layer below the well region.

4. The cellular structure of the silicon carbide MOSFET device according to claim 1, wherein
a side, close to the center of the cellular structure, of the surface of the well region is not completely covered by the source region;
the gate structure comprises a polycrystalline silicon planar gate structure;
a gate insulation layer of the planar gate structure is located above the source region, the well region, and the drift layer, and is in contact with the source region, the well region, and the drift layer at the same time; and
a gate of the planar gate structure is provided above the gate insulation layer.

5. The cellular structure of the silicon carbide MOSFET device according to claim 1, wherein
a side, close to the center of the cellular structure, of the surface of the well region is completely covered by the source region;
the gate structure comprises a polycrystalline silicon trench gate structure;
a gate trench abutting against the well region is provided downwardly in a surface of the drift layer at the center of the cellular structure, wherein the gate trench has a depth that is greater than a depth of the well region, and a sidewall of the gate trench is in contact with the source region, the well region, and the drift layer; and
a gate insulation layer of the trench gate structure is provided at a bottom and walls of the gate trench, and is used to isolate a gate of the trench gate structure provided in the gate trench from the source region, the well region, and the drift layer.

6. The cellular structure of the silicon carbide MOSFET device according to claim 1, wherein the Schottky metal layer is in contact with the source metal layer, so as to form an electrical connection.

7. The cellular structure of the silicon carbide MOSFET device according to claim 1, wherein the Schottky metal layer and the source metal layer are isolated from each other and form an electrical connection via a source compacted block metal layer located above them.

8. The cellular structure of the silicon carbide MOSFET device according to claim 7, wherein
the gate is isolated from the source metal layer, the source compacted block metal layer, and the Schottky metal layer via an interlayer dielectric layer.

9. A silicon carbide MOSFET device, comprising several cellular structures of a silicon carbide MOSFET device according to claim 1.

10. The cellular structure of the silicon carbide MOSFET device according to claim 1, wherein each of the side trenches is located at an edge of the enhancement region that is away from the center of the cellular structure.

11. The cellular structure of the silicon carbide MOSFET device according to claim 1, wherein each of the side trenches extends into the enhancement region.

* * * * *